US008629839B2

(12) United States Patent
Levin et al.

(10) Patent No.: US 8,629,839 B2
(45) Date of Patent: Jan. 14, 2014

(54) DISPLAY SCREEN TRANSLATOR

(75) Inventors: Burton Lee Levin, Lake Oswego, OR (US); Charles Edward Pierson, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 2060 days.

(21) Appl. No.: 11/156,172

(22) Filed: Jun. 17, 2005

(65) Prior Publication Data

US 2006/0287862 A1 Dec. 21, 2006

(51) Int. Cl.
*H03M 11/00* (2006.01)
*G06F 3/048* (2013.01)

(52) U.S. Cl.
USPC .......... 345/173; 341/21

(58) Field of Classification Search
USPC .......... 345/173; 715/864–866, 729; 379/52; 434/112, 116; 341/21, 27; 340/407.2, 340/384.5; 178/18.01; 704/271
See application file for complete search history.

(56) References Cited

U.S. PATENT DOCUMENTS

| | | | | |
|---|---|---|---|---|
| 5,059,960 | A * | 10/1991 | Rosenberg et al. | 345/174 |
| 5,412,189 | A * | 5/1995 | Cragun | 235/379 |
| 5,444,192 | A * | 8/1995 | Shetye et al. | 178/18.09 |
| 6,181,344 | B1 * | 1/2001 | Tarpenning et al. | 715/863 |
| 6,459,364 | B2 * | 10/2002 | Gupta | 340/407.2 |
| 6,864,878 | B2 * | 3/2005 | Stohrer et al. | 345/156 |
| 7,233,321 | B1 * | 6/2007 | Larson et al. | 345/179 |
| 2003/0071859 | A1 | 4/2003 | Takami et al. | 345/865 |
| 2003/0098803 | A1 * | 5/2003 | Gourgey et al. | 341/21 |
| 2003/0218643 | A1 * | 11/2003 | Sakata et al. | 345/865 |
| 2003/0234824 | A1 | 12/2003 | Litwiller | 715/865 |
| 2004/0021648 | A1 * | 2/2004 | Blume | 345/179 |
| 2004/0090428 | A1 * | 5/2004 | Crandall et al. | 345/173 |

FOREIGN PATENT DOCUMENTS

| | | |
|---|---|---|
| JP | 20030066777 | 3/2003 |

* cited by examiner

*Primary Examiner* — Allison Walthall
(74) *Attorney, Agent, or Firm* — Law Office of Gerald Maliszewski; Gerald Maliszewski

(57) ABSTRACT

A system and method are provided for audibly interpreting a screen display. The method comprises: locating a display interpreter (DI) with a tactile matrix of sensors overlying a display screen; in response to sensing a proximate pointer, accepting a tactile matrix region selection; loading a first reference map, cross-referencing DI tactile matrix regions with a first field of screen icons; loading a second reference map, cross-referencing screen icons with audible recordings identifying the screen icons; mapping a screen icon to the selected tactile matrix region; and, audibly identifying the mapped screen icon. That is, the DI uses the second reference map to cross-reference the located screen icon to the audible recording identifying the screen icon, and plays the recording. In one aspect, the DI can be located over a touchscreen with touchscreen icons. Then, the method may further comprise engaging a touchscreen icon.

25 Claims, 12 Drawing Sheets

Fig. 17
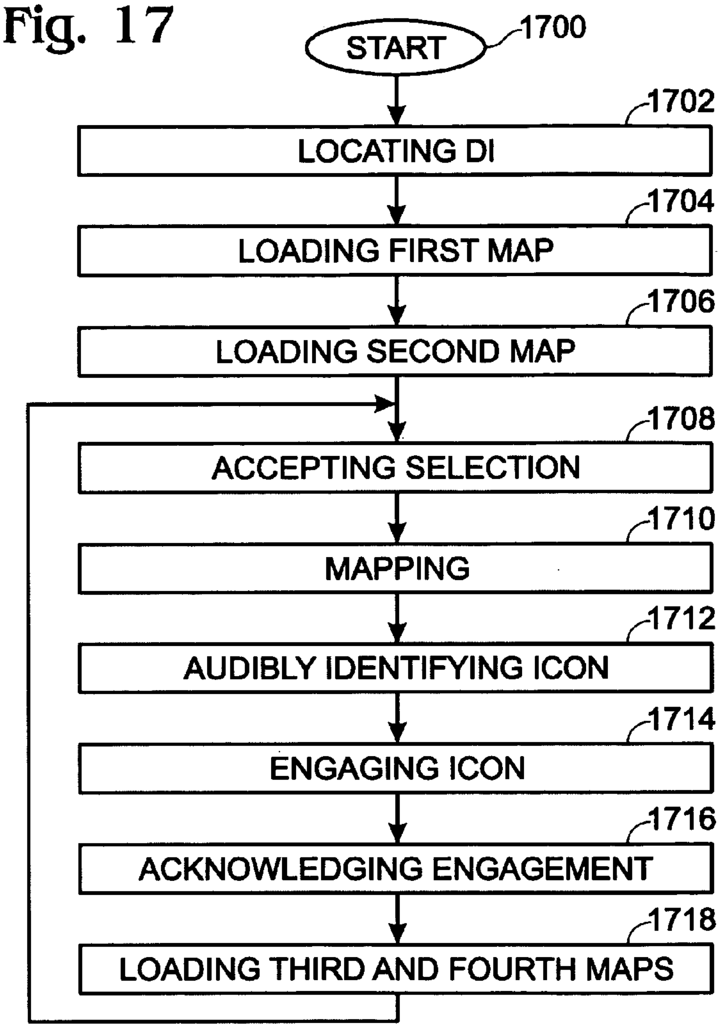
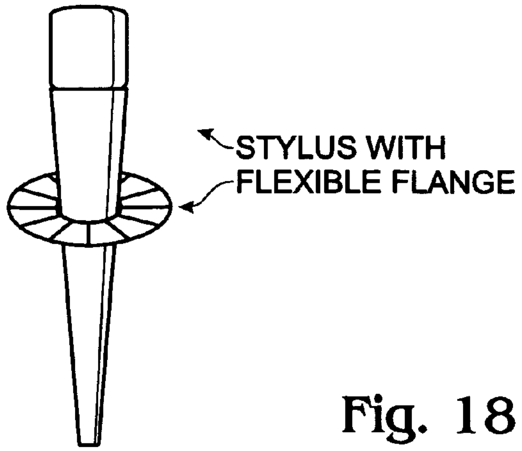
Fig. 18

TEMPLATE WITH TWO POSITION SHUTTER TO BLOCK/ALLOW STYLUS TO ENGAGE THE TOUCHSCREEN

DISPLAY SCREEN TRANSLATOR

BACKGROUND OF THE INVENTION

1. Field of the Invention

This invention generally relates to a user interface for the visually impaired and, more particularly, to a system for translating display screen icons into an audible signal, and manipulating the icons.

2. Description of the Related Art

Visually handicapped people are unable to operate certain equipment, for either job-related or personal use, without accessibility enhancements. These enhancements are not always available. When available, the cost of the enhancements is shared by the sighted community, who has no need for the enhancements. For example, visually handicapped or blind people cannot easily operate equipment utilizing interactive touch screens for feature selection.

FIG. 1 is a multifunctional peripheral (MFP) with a touchscreen display (prior art). MFP's, copiers, printers, and fax machines often use a combination of buttons and touchscreens to enable a user-selected task. While a visually handicapped person may memorize the physical location of the buttons, it is difficult for that person to locate any particular icon on a touchscreen. The fact that a blind person has difficulty in operating equipment that uses a touchscreen may limit their job opportunities and responsibilities.

Manufacturers are reluctant to add accessibility extensions to their equipment, as these extensions add cost and complexity to the equipment. The increased purchase price associated with these accessibility extensions places their product in an inferior competitive position.

When accessibility extensions are requested or mandated by law, the additional cost associated with the equipment imposes an unfair burden on the sighted user community. Some examples of low cost accessibility-aided options include equipment that uses Braille keypads in elevators and ATMs. Other equipment however, such as an audio-enabled ATM, is relatively complex, and adds significant purchase and maintenance costs. These additional costs must be passed on to all consumers, despite that fact that these features are only used by a small minority.

It would be advantageous if touchscreens and displays could be made more accessible to the visually handicapped.

It would be advantageous if touchscreens and displays could be made more accessible without adding costly modifications to conventional equipment.

SUMMARY OF THE INVENTION

The present invention is a display interpreter (DI) that is physically independent of the equipment being accessed by the visually impaired user. The DI can be operated without modifications or additions to conventional equipment, avoiding any cost or complexity that might otherwise be added for accessibility support for the visually impaired.

The DI may be composed of the following hardware and software components: a tactile matrix interface (TMI) and a display interface, which in its simplest form is a cover plate that is temporarily placed on top of the equipment's touchscreen. The cover plate prevents users from accidentally activating an icon with their finger. Instead, it has sensors to locate the physical position of the user's finger on the cover plate. The cover plate sends the position of the user's finger to a map module as described below. The cover plate's physical positioning on top of the touch screen takes advantage of the fact that touchscreens typically are recessed. The recessing provides two edges to use to orient the cover plate.

A stylus is used for depressing the touchscreen at any icon location desired. In one version it has no circuitry or functionality beyond being a pointer that is pushed through a hole in the cover plate in order to activate an icon on the equipment. An alternate version can be used to activate an icon on the equipment touchscreen and send a signal to the map module automatically.

The map module is a programmable device that contains a database of icons and their attributes for every function displayable on the equipment's touchscreen. The map module may receive the x, y position information from the TMI. It processes the coordinates received from the TMI and identifies the icon and/or screen. However, the invention may use other types of coordinate systems, such as polar, or positions relative to landmarks or previous selections. Once it has identified the icon, it provides audio feedback to the user describing the icon's function. It is programmable for different touchscreen formats and functions.

Furthermore, the map module can store the icons for many different device types and models. The user may manually select the appropriate equipment from a menu supplied by the map module. This selection can be done by the visually handicapped.

The various screen layouts and icon functions are stored in a flat file system or database for navigating through the icons and screens, allowing the user to choose from the functionality available in the displays. This database can be stored in the map module. Software, executing in the map module, cross-references the positional information of each icon with the current location of the user's finger on the TMI. Based on the location, the software outputs an audio description of the icon, along with the effect if activated.

The receiver, processor, database creation, and audio response may all be implemented in the map module. In one aspect, the map module can be located in a conventional PDA or other portable device, provided the processor can respond in real-time to the movement of the user's finger across the TMI.

Given the unit and features listed above, a visually handicapped person can locate the icons on any display and navigate from screen display to screen display, making an accurate selection of functions and features. As each desired icon is located, the stylus is used to active the function.

Accordingly, a method is provided for audibly interpreting a screen display. The method comprises: locating a DI with a tactile matrix of sensors overlying a display screen; in response to sensing a proximate pointer, accepting a tactile matrix region selection; loading a first reference map, cross-referencing DI tactile matrix regions with a first field of screen icons; loading a second reference map, cross-referencing screen icons with audible recordings identifying the screen icons; mapping a screen icon to the selected tactile matrix region; and, audibly identifying the mapped screen icon. That is, the DI uses the second reference map to cross-reference the located screen icon to the audible recording identifying the screen icon, and plays the recording.

In one aspect, the DI can be located over a touchscreen with touchscreen icons. Then, the method may further comprise engaging a touchscreen icon. In situations where the selection of an icon generates a new screen, the method further comprises acknowledging a touchscreen icon engagement. Following the acknowledgement of the touchscreen icon engagement, the DI loads a third reference map, cross-referencing DI tactile matrix regions with a second field of (touch)screen icons, and loads a fourth reference map, cross-referencing touchscreen icons with audible recordings identifying the touchscreen icons.

Additional details of the above-described method and an audible screen display interpreter (DI) system are provided below.

BRIEF DESCRIPTION OF THE DRAWINGS

FIG. 17 is a flowchart illustrating a method for audibly interpreting a screen display.

FIGS. 18 and 19 depict some exemplary means for preventing the accidental engagement of touchscreen icons.

DETAILED DESCRIPTION

Figure 2:
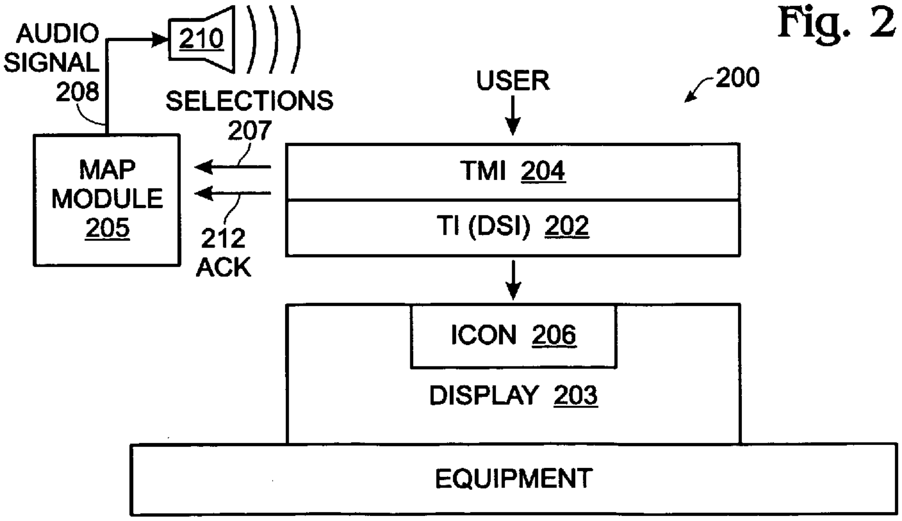
FIG. 2 is a schematic block diagram of an audible screen display interpreter (DI) system.

FIG. 2 is a schematic block diagram of an audible screen display interpreter (DI) system. The system 200 comprises a display screen interface (DSI) 202, which overlies a display 203, and a tactile matrix interface (TMI) 204. The tactile matrix interface 204 accepts tactile matrix region selections 207. A map module 205 maps a selected tactile matrix region to an underlying screen icon 206, and generates an audio signal 208 that identifies the mapped screen icon 206. An audio output generator 210 projects the audio signal 208. For example, the audio generator 210 can be a speaker or an earphone jack.

In one aspect, there are buttons or switches along the edge of the display (not shown) that permit the user to make choices. The identification of icons in close proximity to an off-screen switch helps the user select a desired function. In some aspects the display screen interface 202 is a touchscreen interface (TI) for engaging a touchscreen icon. That is, the display 203 is a touchscreen and, rather than merely audibly identifying a particular icon 206, the DI 200 can act to trigger (touch) the icon. If the engagement of a touchscreen icon leads to the generation of a new display screen with a new field of icons, the TMI 204 generates an acknowledgement (ACK) 212 in response to the engagement of a touchscreen icon.

As used herein, a "display icon", "screen icon", "icon", or "touchscreen icon" is a symbol, representation, choice, or information that is graphically presented on a display screen. In the case of a touchscreen, the icon can be triggered (engaged) to signify the selection of an offered equipment function. As used herein, "equipment" is a conventional device with a display or touchscreen. For example, a conventional MFP can be equipment. However, the invention is applicable to any conventional equipment that uses a display screen or a touchscreen.

Figure 3:
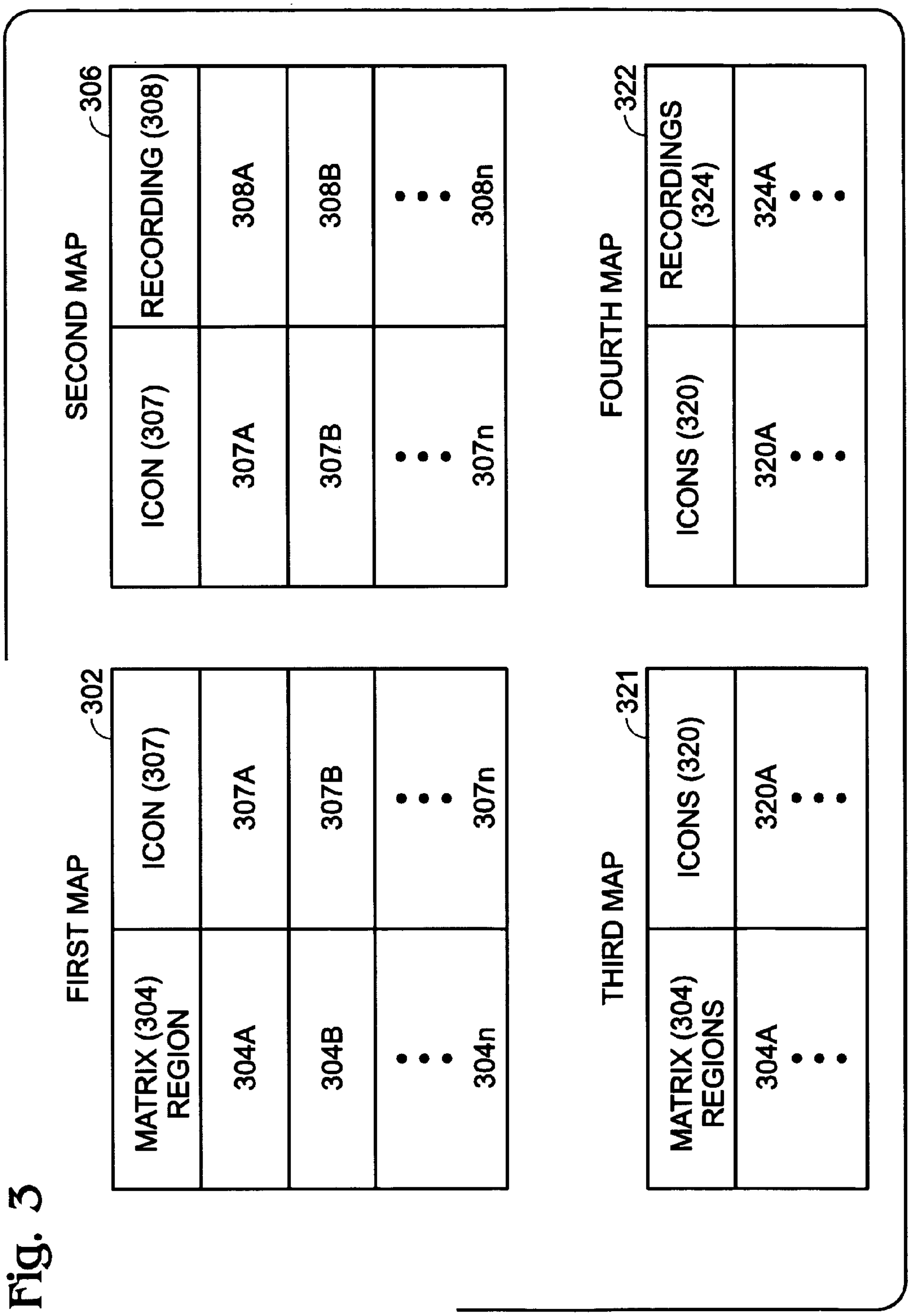
FIG. 3 is a schematic diagram of a DI map module.

FIG. 3 is a schematic diagram of a DI map module. The map module includes a first reference map 302 that cross-references tactile matrix regions 304 with a first field of icons 307. A second reference map 306 cross-references screen icons 307 with audible recordings 308 identifying the screen icons. The map module supplies an audio recording identifying a screen icon 307 (see FIG. 2), in response to accepting the selection of a tactile matrix region 304. The field of screen icons 307 matches the display icons of FIG. 2. For example, if a particular tactile matrix region 304A is selected, the map module uses the first map 302 to locate an icon 307A associated with region 304A. In this example, the icon 307A represents a printer function "contrast". The map module 205 uses the second map 306 to cross-reference icon 307A to a recording 308A, which causes the word "contrast" to be audibly generated. Note, the icons 307 in the map module match the actual icons (206, see FIG. 2) that are displayed on the equipment screen.

For the sake of clarity, the processes of receiving TMI region selections, and mapping the selections to recordings have been described as separate functions occurring in different DI modules. However, it should be understood that these processes may be performed in a single DI processing module (DIPM), which may include a microprocessor, a memory including maps and program software instructions. The TMI, DIPM, or map module is not limited to any particular means of performing their functions.

Figure 4:
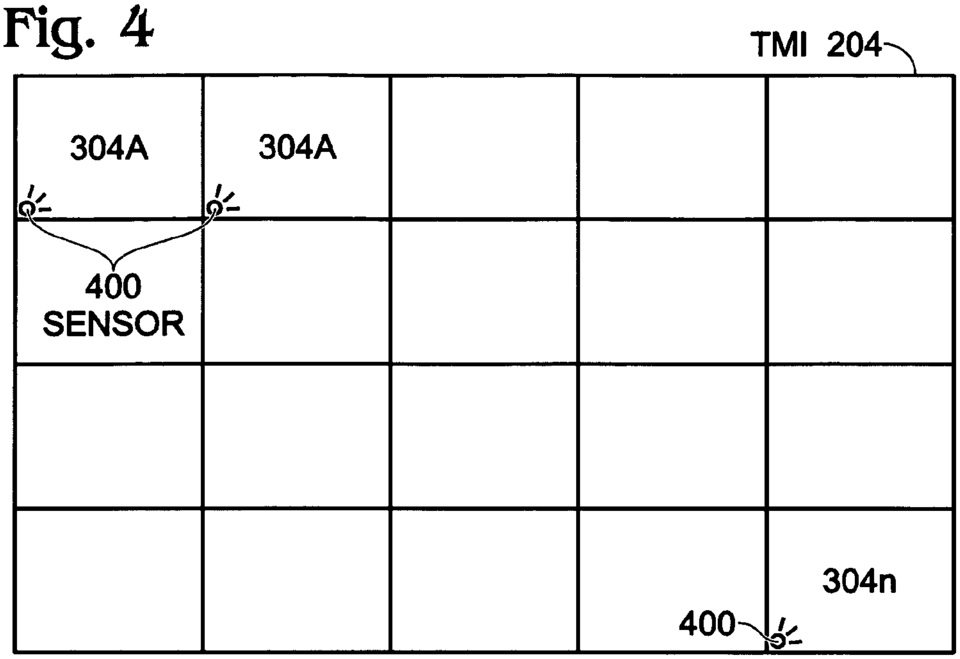
FIG. 4 is a drawing depicting a first aspect of the DI.

FIG. 4 is a drawing depicting a first aspect of the DI. As shown, the TMI 204 includes a sensor 400 for monitoring a proximate pointer. Typically, there is a separate sensor 400 associated with each particular TMI region 304. The map module (205, see FIGS. 2 and 3) uses the first reference map 302 to cross-reference a screen icon 307 to the tactile matrix region 304 generating a proximate pointer sensor signal 402. The map module 205 uses the second reference map 306 to cross-reference a screen icon 307 to the audible recording 308 identifying the screen icon 307. The audio output generator (210, see FIG. 2) plays the recording 308 identifying the screen icon 307.

Figure 5A:
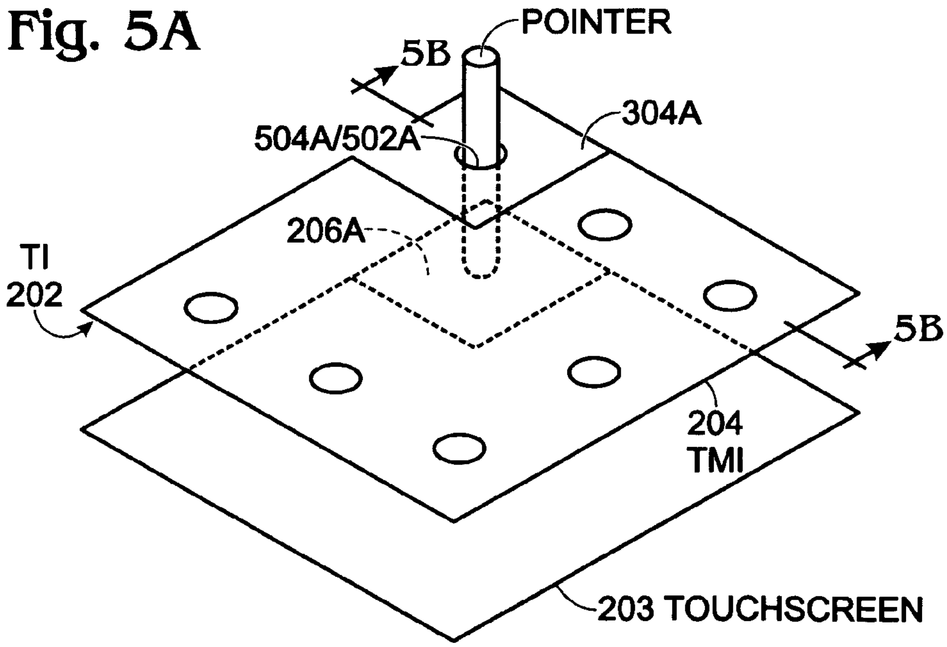
FIG. 5 shows perspective and cross-sectional views of a second aspect of the DI.
Figure 5B:
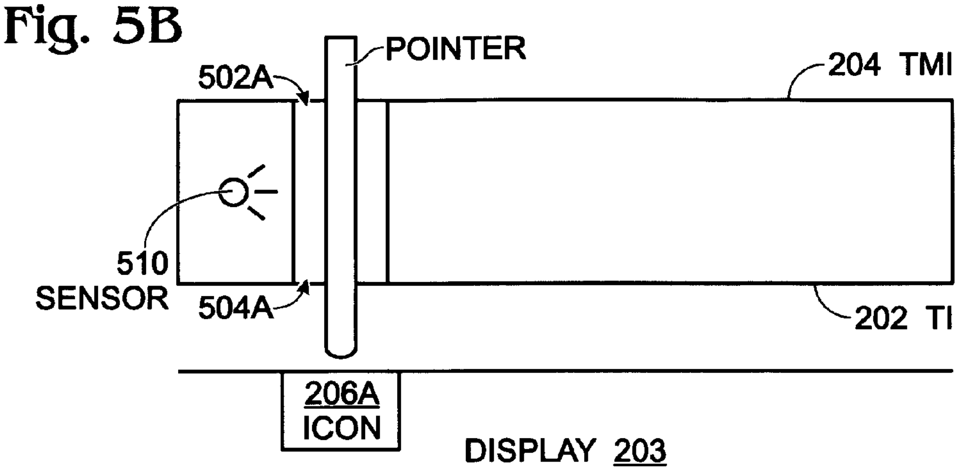

FIG. 5 shows perspective and cross-sectional views of a second aspect of the DI. In this very simple form of the invention, the TMI 204 (or the TI 202) generates an acknowledgement signal 212 in response to accepting a pointer in a first opening 502A in the tactile matrix interface 204 associated with the first region 304A. The touchscreen interface 202 engages a first touchscreen icon 206A by guiding a pointer through a first opening 504A in the touchscreen interface 202 directed at the first touchscreen icon 206A. More generally, the tactile matrix interface 204 and touchscreen interface 202 form a matrix of cooperating openings 502, where each opening is associated with a tactile matrix region 304 and directed at a corresponding touchscreen icon 206. In a very simple form, the TMI and TI are a cover plate with openings to accept a stylus.

For example, a user may run their finger or pointer over the TMI 202, listening for the recording of the icon they are seeking. This search process has been referred to above as a TMI region selection. Once the user has identified an opening associated with the icon they are seeking, a pointer is inserted into the hole. The hole and pointer are sized so as to cause the pointer to engage the underlying screen icon. That is, the desired touchscreen icon is touched by the pointer.

The acknowledgement signal may be generated by a stylus (as explained below), or by the TMI 204. For example, the TMI 204 may further comprise a hole sensor 510 associated with each opening 502, to generate an acknowledgement signal in response to sensing a pointer in the opening.

In another simple aspect, the TI 202 and TMI 204 are a thin membrane on standoffs that includes sensing circuitry. The sensing circuitry detects TMI region selections by sensing the user's finger position on the membrane. Once the user hears an audible indication that their finger is over a desired icon, the user merely presses down on the membrane. The membrane is thin enough to directly transfer the pressure to the underlying touchscreen. In some aspect, the generation of sufficient pressure on the TMI 204 generates an acknowledgement signal, indicating that the user has pressed a particular icon. The membrane technology is conventional and is used for keypads and cash register data entry to name a couple of examples.

In other forms of the DI not shown, the TI 202 generates mechanical pressures or electrical signals that cause the touchscreen icons to be engaged. Although a DI that generates mechanical pressure may be more complicated, or a DI that generates electrical signal may require some equipment modifications (i.e., an electrical jack built into the equipment to accept an electrical connection from the TI 202), this aspect of the invention permits the TMI regions to be decoupled from the underlying touchscreen icons. This aspect may be advantageous if the touchscreen icons are all grouped together in a small region of the screen. By decoupling the 1:1 relationship between TMI regions and touchscreen icons, accidental selections can be minimized. This aspect can also be used to present a common TMI region to the user, regardless of the manufacturer or model of the equipment being used.

Figure 6:
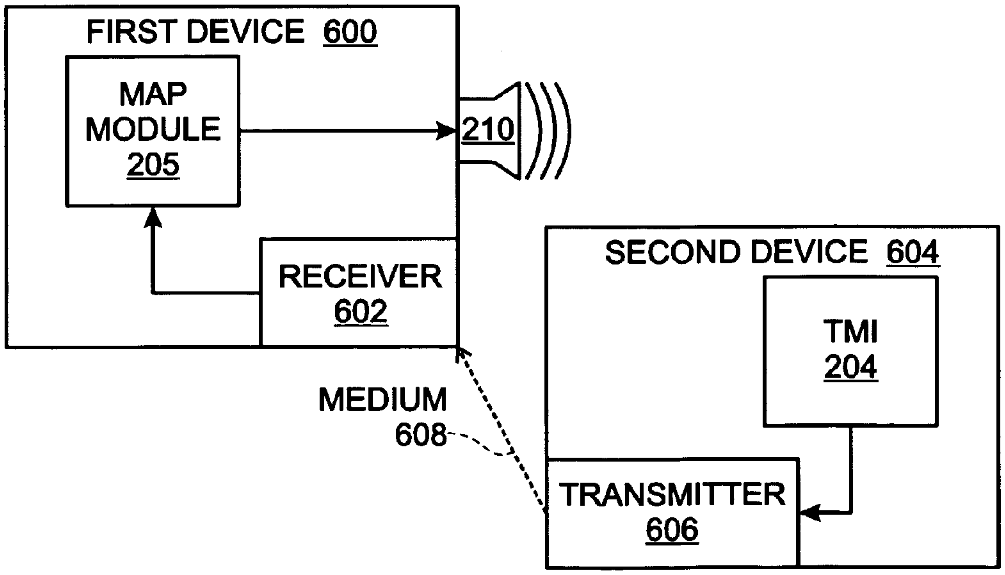
FIG. 6 is a drawing depicting a third aspect of the DI.

FIG. 6 is a drawing depicting a third aspect of the DI. The previous examples have implied that all the DI modules are embedded in a single device. However, the above-mentioned DI functions may be performed between separate devices that are in communication with each other. The DI map module 205 may be embedded in a first device 600 with a first communication medium receiver 602. The tactile matrix interface 204 (as well as the DSI or TI) may be embedded in a second device 604 with a first communication medium transmitter 606 to supply the tactile matrix region selections to the map module 205. The communication medium 608 can be a wire with jacks, or Bluetooth wireless communications to name a couple of the many means that can be used. For example, the TMI 204 and DSI may be associated with a device 604 that is plate, box, or film membrane that overlies a display screen, while the map processing functions are embedded in a portable device 600 such as a cell phone or a PDA. Since a cell phone includes a speaker, the cell phone can be used to play the icon recording. That is, the audio output generator 210 is embedded with the map module 205. In other aspects, a stylus with a transmitter (described below) supplies TMI region selections to a map module embedded in portable device 600.

Alternately, if the first device 600 has no speaker, the audio signal can be communicated back to the second device 604, which may include an audio signal generator 210 (not shown). In this case receiver 602 and transmitter 606 are transceivers.

Figure 1A:
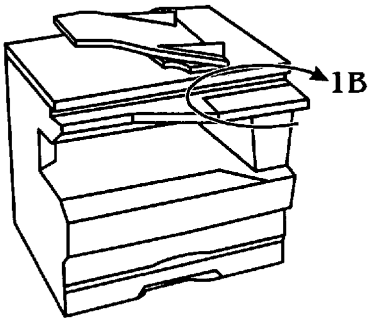
Fig. 1A (PRIOR ART)
FIG. 1 is a multifunctional peripheral (MFP) with a touchscreen display (prior art).
Figure 1B:
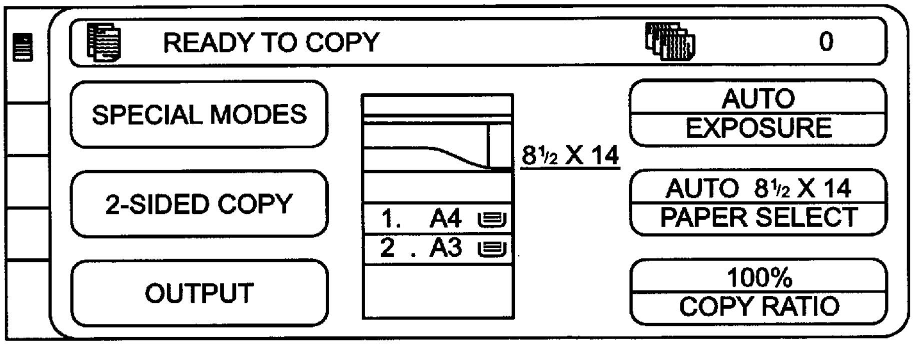
Fig. 1B (PRIOR ART)

Returning to FIG. 3, in some aspects the map module 205, in response to accepting an engagement acknowledgement (212, see FIG. 1) from the TMI 204, loads a third reference map 321, cross-referencing tactile matrix regions 304 with a second field of touchscreen icons 320, and loads a second reference map 322, cross-referencing touchscreen icons 320 with audible recordings 324 identifying the touchscreen icons (from the second field). This enables the user to interact with a new screen of icons, after the selection of an icon from a previous screen.

Figure 7:
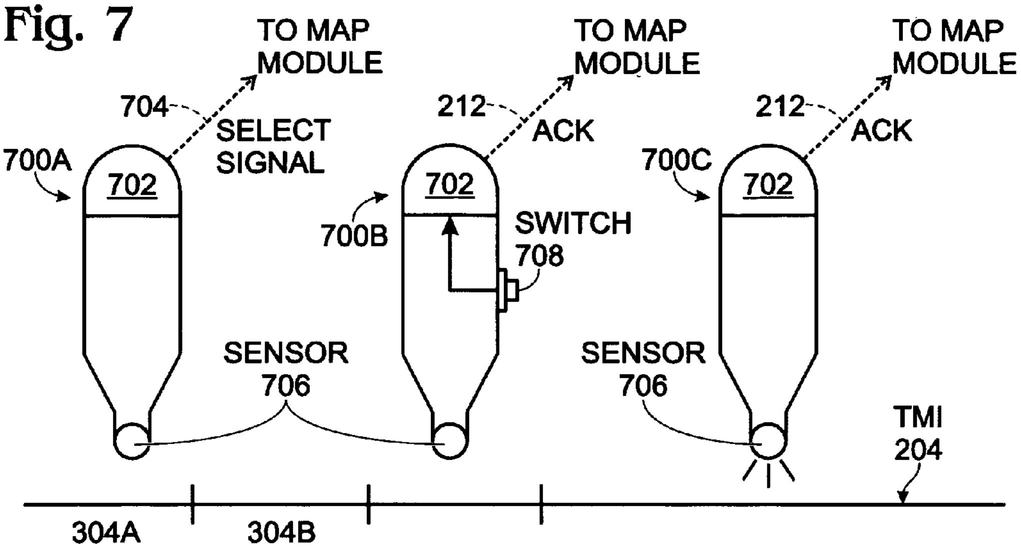
FIG. 7 is a drawing depicting a fourth aspect to the DI, which is an alternative to the second aspect of FIG. 5.

FIG. 7 is a drawing depicting a fourth aspect to the DI, which is an alternative to the second aspect of FIG. 5. In all the above-mentioned examples the DI uses a pointer, or "dumb" stylus, which includes no circuitry. In these aspects of the DI, a pointer can be a tool that is specially design to cooperate with openings in the DI. A pointer can also be a finger or a pencil, for example. However, the pointer may alternately include circuitry to enable DI functions. This type of a pointer is referred to herein as a stylus. The stylus can be used to select a TMI region, send an acknowledgement of a touchscreen engagement, or both. Therefore in one aspect, the TMI 204 includes a stylus 700A with a transmitter 702 to send a region select signal 704 in response to being located proximate to a tactile matrix region. For example, the stylus may include a sensor 706 that is able to distinguish between different TMI regions. Note, the stylus transmitter 702 is not limited to any particular communication medium or protocol. For example, the region select signal 704 may be carried via a wire or wirelessly.

In another aspect, the stylus 700B includes a switch 708, as well as transmitter 702 to send an acknowledgement 212 of a touchscreen icon engagement in response to initially selecting a tactile matrix region 304 and engaging the switch 708. This aspect assumes that the stylus 700 (or some other device) has been used to touch a touchscreen icon. Alternately, the stylus transmitter 702 can to send an acknowledgement of a touchscreen icon engagement in response to being inserted into a tactile matrix interface opening. For example, stylus 700C includes a sensor 706 can be used to determine that the stylus has been inserted a sufficient depth to engage the underlying touchscreen. If the stylus 700 uses a wireless transmitter 702 for generating either an acknowledgement or region select signal, then the map module would also include a wireless receiver accepting the acknowledgement signal from the stylus 700.

Functional Description

Figure 8:
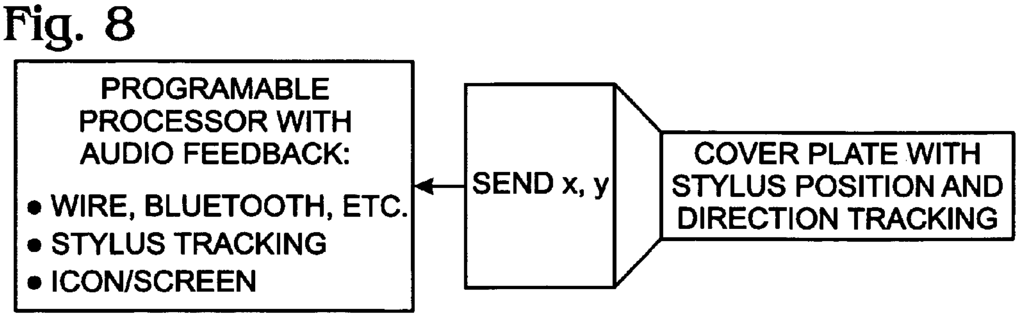
FIG. 8 is a schematic diagram addressing the DI functionality.

FIG. 8 is a schematic diagram addressing the DI functionality. A portable DI is able to locate and activate icons on a touchscreen. For example, a user may enter a code into the DI for a particular piece of equipment that they intend to use. The user positions a DI over the equipment touchscreen, depresses the 'ready' key on the DI, and proceeds to move their finger over the TMI. The DI is designed so that all the selection functions can be performed by touch.

Figure 9:
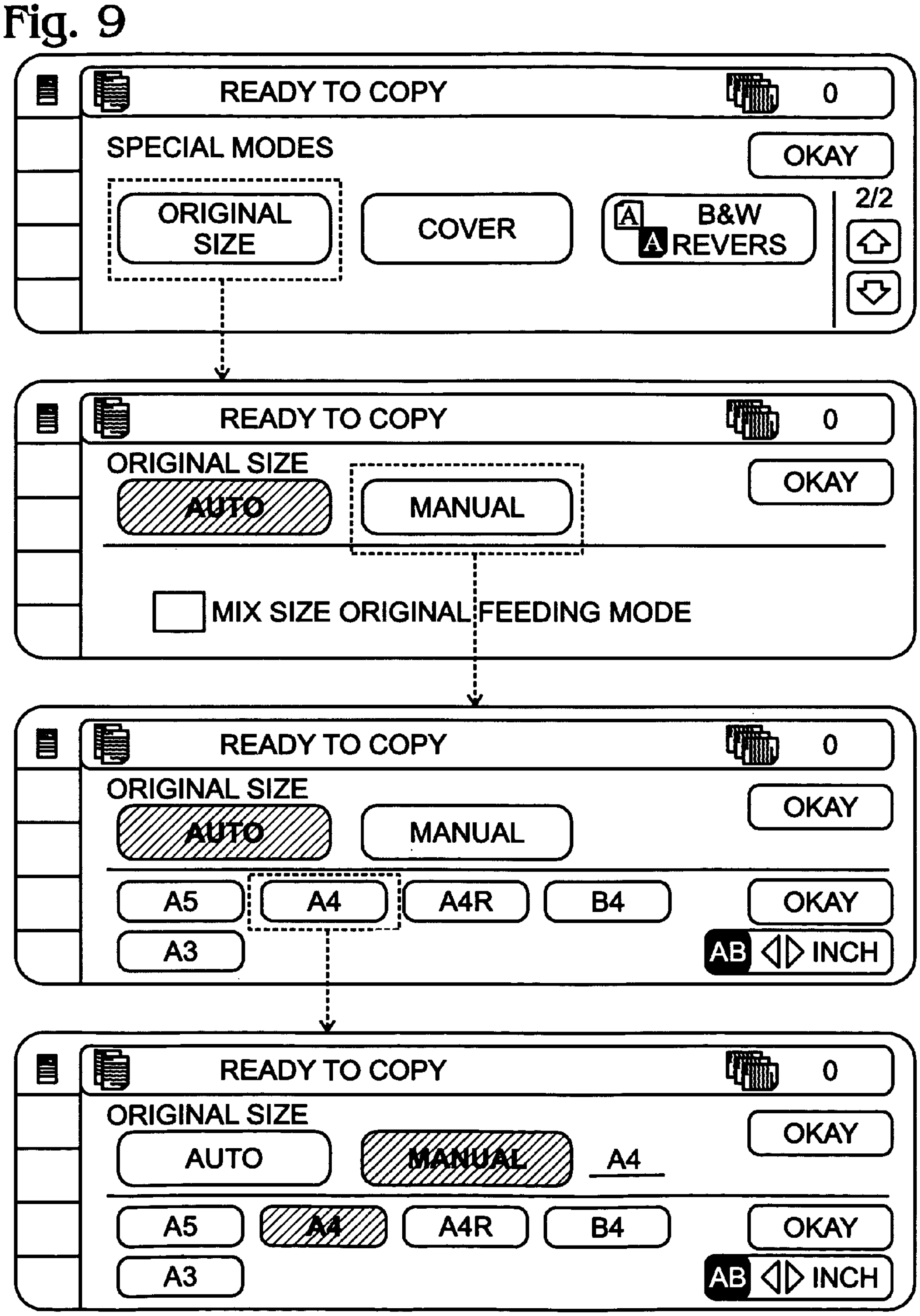
FIG. 9 is a diagram depicting a series of display screens with different icons.

FIG. 9 is a diagram depicting a series of display screens with different icons. For many different products today, a touchscreen functions as an input/output device for choosing actions to be taken by the product, e.g., copy a document or fax a document. Icons on the display may also link to new screens for additional functions, e.g., choosing 'multiple copies' may lead to a new screen listing additional finishing options, such as, collation, stapling, etc. It may also permit the selection of different media.

Figure 10:
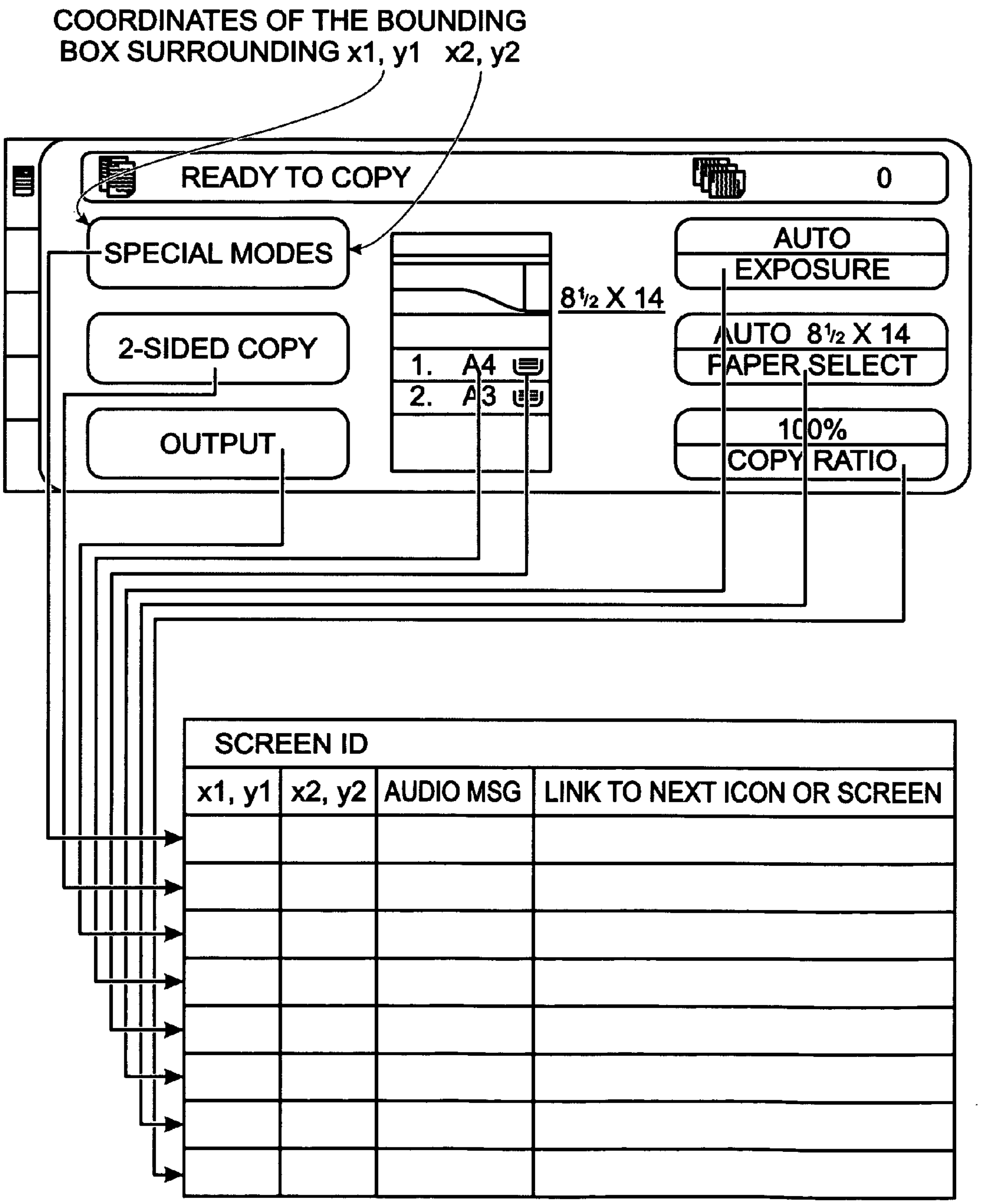
FIGS. 10 and 11 depict the linkage between screens, icons in the screen, and the next screen to appear.
Figure 11:
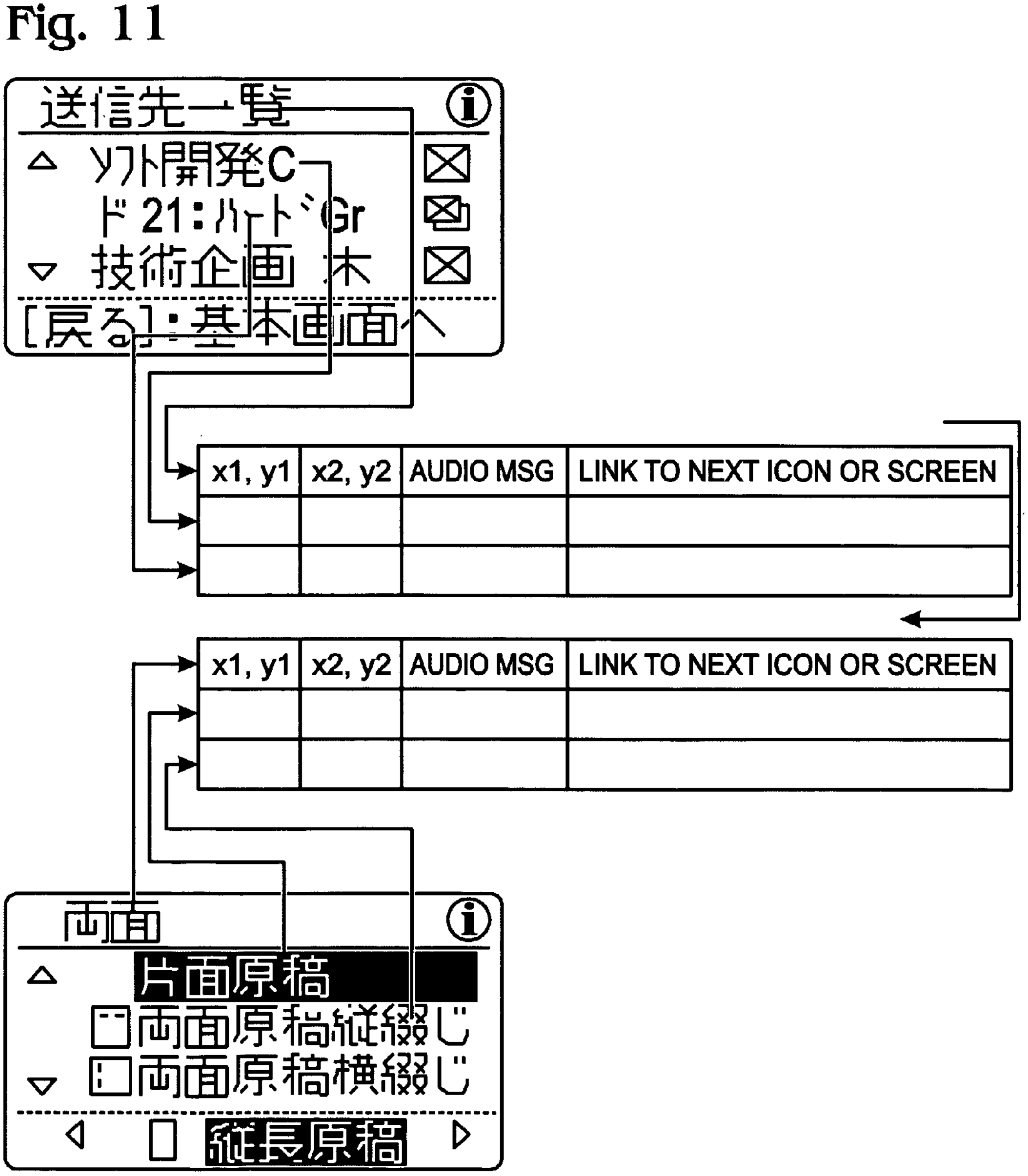

FIGS. 10 and 11 depict the linkage between screens, icons in the screen, and the next screen to appear. In a manner similar to conventional equipment, the DI maintains a flat file system or database of all the icons, the screens in which they appear, the link to a next screen, and the boundary box dimensions of each icon. This database is created by visual examination of each icon displayed on the equipment touch screen.

The TMI can be connected either by wire or wirelessly to the map module, which provides tracking information. The map module uses the tracking information to identify any function to which the user is currently pointing, and sends an audio description of that function back to the user. When the user is notified that their finger is over the correct icon, they push the stylus through a hole over that icon to select the function.

Figure 12:
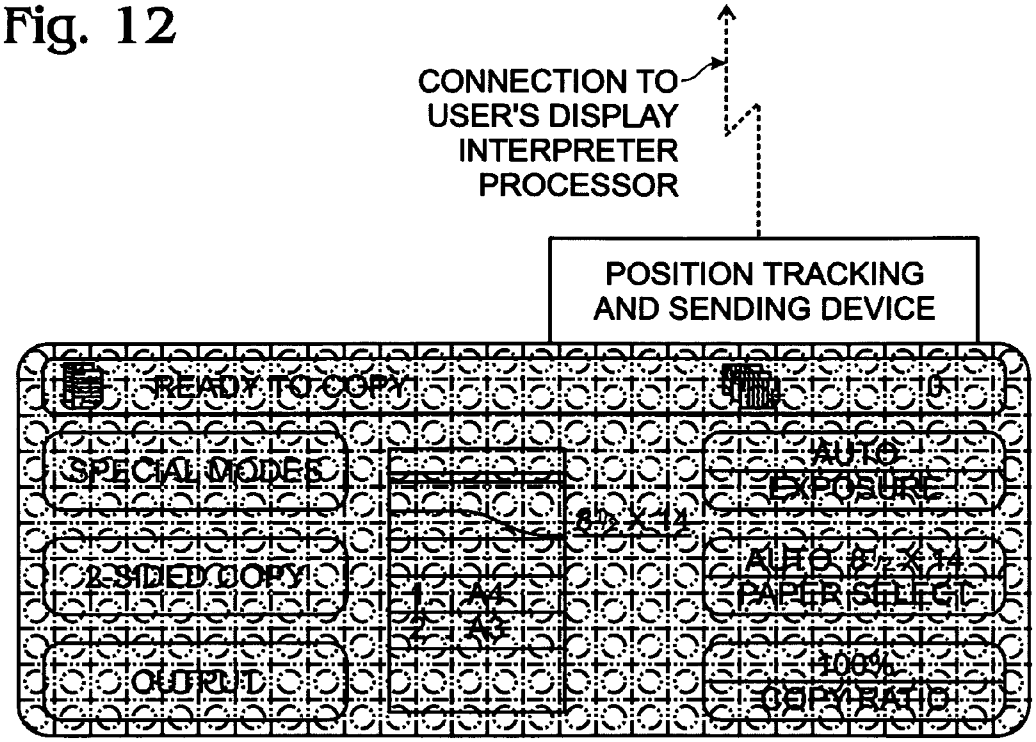
FIGS. 12 and 13 depict the TMI with openings to accept a pointer or stylus.
Figure 13:
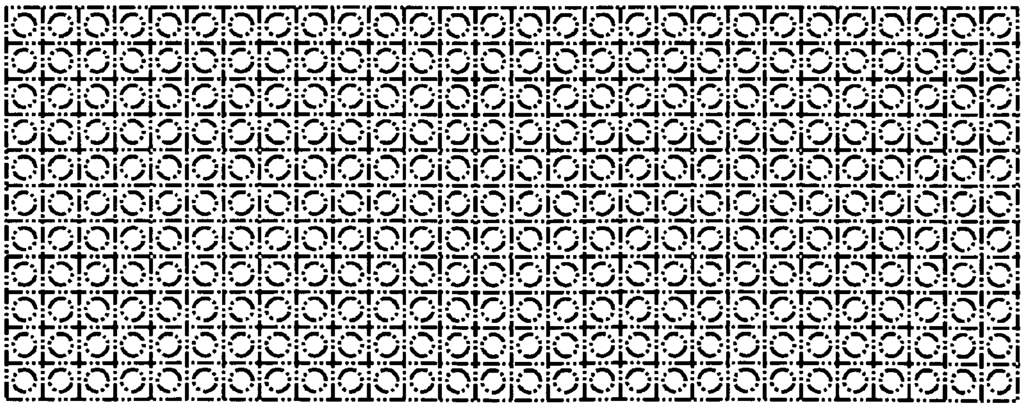

FIGS. 12 and 13 depict the TMI with openings to accept a pointer or stylus. The TMI and TI (or DSI) may be enabled as part of a cover plate that is placed over the equipment's touchscreen whenever a visually handicapped person wants to use it. It can be removed after the user is through with the equipment. The cover plate can be placed and adjusted by touch only, eliminating the need for someone sighted to install the fixture. It is easy to place, adjust, and remove. Sensors on the TMI cover plate track the physical location of the user's finger on a grid as the finger moves over the surface. Typically, the TMI cover plate is at least as large as, or larger than the equipment's touchscreen. Note, the DI may track the location of the user's pointer and generate an audible message if they move beyond the boundaries of the equipment's touchscreen.

Circuitry on the TMI transmits the physical location of the user's pointer to the map module, as it moves across the TMI surface. In a simple aspect, the DI includes a grid of holes through which a pointer can be inserted to depress the desired icon on the equipment's touchscreen.

Figure 19:
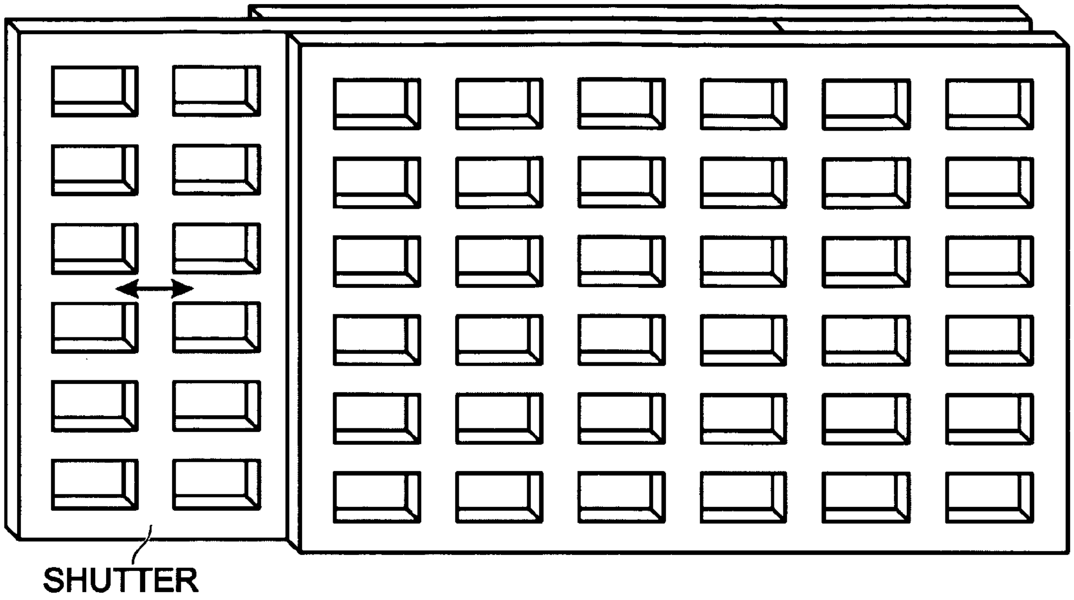

FIGS. 18 and 19 depict some exemplary means for preventing the accidental engagement of touchscreen icons. A problem may occur if the user inserts the pointer into the wrong hole, thereby, activating the wrong icon. In this case, the user is immediately notified of which icon is activated, and so knows of the error. However, the user has no way of easily recovering from the error. In one case, the action may result in ending the option selection phase and the equipment starts processing, not expecting further direction from the user. This may cause serious, unintended results. Alternately, the user makes an unintended selection and needs to backtrack from the last choice. Unless the equipment has a built-in way (for example, a clear button) to step back and reset to the previous choice, the user has no choice but to reset back to the beginning and start all over. This solution is inefficient.

A better solution is to provide a mechanism to help the user avoid activating the wrong icon. Two approaches are presented as examples. The first approach is to design the holes in the DI such that the user inserts the stylus to a depth sufficient to provide an audio confirmation of the hole selected. Once the user has heard the confirmation, the user can proceed with completing the insertion of the stylus sufficient to engage the touch screen. If the user is careless with inserting the stylus, then this solution has the disadvantage of allowing the user to insert the stylus too far on the first phase, thus engaging the touchscreen without first obtaining the audio confirmation.

The problem of accidentally engaging the touchscreen before getting audio confirmation can be resolved in many ways. For example, the stylus can be constructed with a flexible flange, see FIG. 18. The user can feel when the flexible flange is touching the surface of the DI and the user can stop at that fixed location. In this position, the stylus has been inserted far enough to obtain the audio feedback, but not far enough to engage the touchscreen. Once the user is confident that the stylus is in the correct hole, the user exerts enough pressure to fold the flange backward, thus enabling the stylus to penetrate to the touchscreen. Other designs of the stylus, to obtain the same control on penetration, are possible.

Another solution, even more secure, is to design the DI such that the holes are closed with a shutter, or other slide mechanism, blocking the holes, see FIG. 19. The hole-closure shutter is manually released by the user after the stylus is inserted and the user has received audio confirmation.

Figure 14:
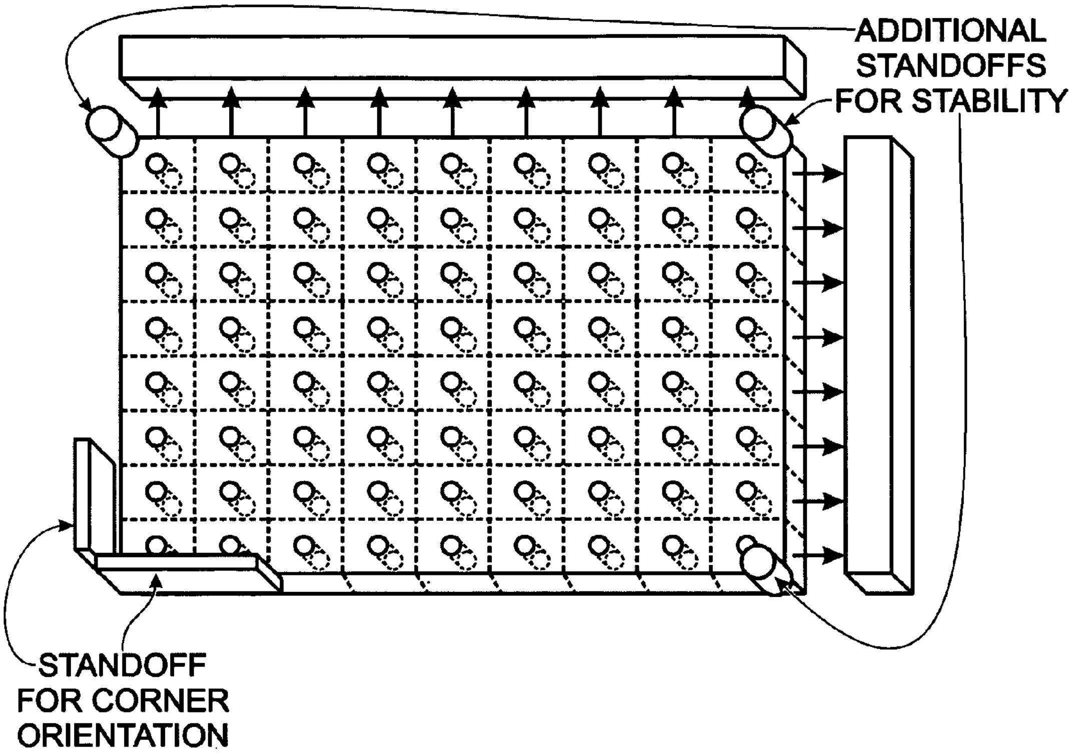
FIG. 14 is a drawing depicting a means for locating the DI over a display screen.

FIG. 14 is a drawing depicting a means for locating the DI over a display screen. The DI may have standoffs that hold the DI physically off the touchscreen, permitting the DI to remain stable while in use. The standoff at one corner may function as the origin. Another design permits the DI to fit into a recessed corner of the typical touchscreen, thereby orienting the fixture in the horizontal and vertical directions.

Figure 16:
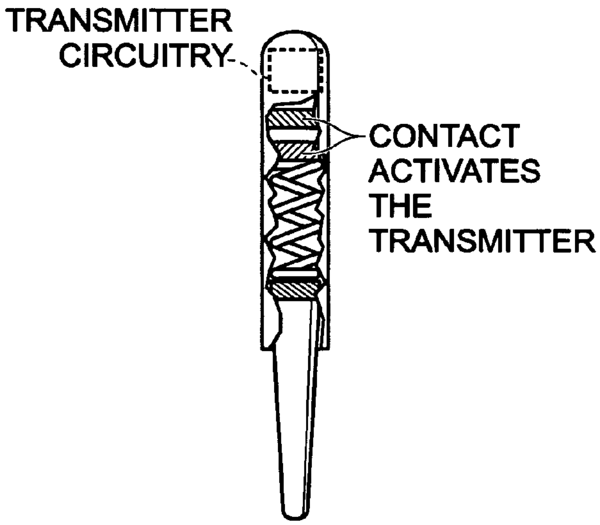
FIGS. 15 and 16 are drawings depicting a pointer and a stylus, respectively.
Figure 15:
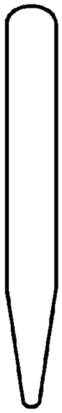

FIGS. 15 and 16 are drawings depicting a pointer and a stylus, respectively. In FIG. 15 a simple stylus (pointer) is shown that is small enough to fit through the TMI holes, and is used for activating an icon. FIG. 16 depicts an alternate version with a transmitter that automatically sends a signal to the map module whenever the stylus is used to activate an icon on the equipment.

The map module is one of the main processing components of the display interpreter. The map module may function in two modes: database creation, and display interpretation and navigation. The map module contains the database of icons and screens.

Buttons on the DI may serve several functions. One button may signal that the user has positioned the DI and is about to start a scan of the icons. Another button may serve notice to the map module software that the stylus has been used to activate an icon on the equipment (acknowledgement signal). This button is used with the simple pointer for example, whereas a stylus with a transmitter automatically notifies the map module whenever an icon is activated.

Buttons can also be used to support entering, deleting, and correcting entries in the icon database. Another button can be used to initiate the loading of new software for the map module.

The display interpreter has two basic modes, database creation and display interpretation. Database creation is typically accomplished by a sighted person. Information about each icon is stored as a separate entry in the database. Each icon is manually measured for height, width, and coordinates within the touch screen display of the equipment. Note, this approach is acceptable since the resolution of the touchscreen cannot be altered (unlike traditional computer screens in which changing the resolution can affect the location and dimension of an icon). This information is entered into the database. Each database entry also has a screen name, an audio file describing the function, and a next action to be taken whenever the icon is activated. Optionally, the equipment itself can send the icon information directly or on a media for downloading to the map module.

The DI is setup and used as follows. The DI is placed on the touchscreen by orienting the standoff representing the origin in the correct corner of the recessed screen (the correct corner is a matter of implementation and can be arbitrarily be any of the four corners). The map module is signaled that the DI is in place by depressing an appropriate key on the TMI.

The user places a finger on the TMI and begins to slowly traverse the surface in any direction. The TMI and map module track the finger's location in real-time, announcing each icon as the finger enters the icon's bounding box. The user stops moving their finger when the correct icon is found. The user inserts a pointer or stylus into the hole under their finger and touches the icon on the equipment touch screen. If a pointer is used, the user presses an action key on the TMI signaling that an icon was chosen. If a transmitting stylus in is used, then this action is unnecessary because the signal is automatically sent to the map module. In another variation, either the TMI or TI senses the insertion of a pointer through a hole and automatically sends an acknowledgement signal to the map module.

A voice message identifies the next action to be taken, e.g., a new screen has appeared or the next set of icons that follow the action just taken. The user continues to traverse the TMI until all options have been selected for this task. The use of the DI/equipment touchscreen may coincide with the use of a keypad on the equipment that is marked in Braille, marked with some other tactile identifiers, or unmarked, but whose positions have been memorized by the user.

FIG. 17 is a flowchart illustrating a method for audibly interpreting a screen display. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1700.

Step 1702 locates a display interpreter (DI) with a tactile matrix of sensors overlying a display screen. Means of locating have been described above (i.e., the use of standoffs and corner locators). Step 1704 loads a first reference map, cross-referencing DI tactile matrix regions with a first field of icons. Step 1706 loads a second reference map, cross-referencing screen icons with audible recordings identifying the screen icons. Step 1708, in response to sensing a proximate pointer, accepts a tactile matrix region selection. Step 1710 maps a screen icon to the selected tactile matrix region. Step 1712 audibly identifies the mapped screen icon. More specifically, Step 1712 may include the substeps of: using the second reference map, cross-referencing the located screen icon to the audible recording identifying the screen icon; and, playing the recording.

In some aspects, Step 1702 locates a DI overlying a touchscreen with touchscreen icons. Then, additional steps may occur. Step 1714 engages a touchscreen icon. Step 1716 acknowledges a touchscreen icon engagement. Step 1718, following the acknowledgement of the touchscreen icon engagement, loads a third reference map, cross-referencing tactile matrix regions with a second field of touchscreen icons, and loads a fourth reference map, cross-referencing touchscreen icons with audible recordings identifying the touchscreen icons.

In one aspect, accepting the tactile matrix region selection in Step 1708 includes monitoring a tactile matrix region sensor for a proximately located pointer. Then, mapping the screen icon to the selected tactile matrix region (Step 1710) comprises, in response to sensing a proximately located pointer, cross-referencing the selected tactile matrix region to locate the screen icon, using the first reference map.

Alternately, accepting the tactile matrix region selection in Step 1708 includes the substeps of: accepting a stylus with a transmitter, located proximate to a tactile matrix region; and, generating a region select signal from the stylus in response to locating the stylus proximate to the tactile matrix region.

In another aspect, acknowledging the touchscreen icon engagement in Step 1716 includes the substeps of: defining an opening through the DI associated with the mapped touchscreen icon; and, accepting a pointer in the defined opening. Then, engaging the touchscreen icon in Step 1714 includes directing the pointer to the touchscreen icon through the defined opening. In this aspect it is typical that Step 1702 locates a DI with a matrix of openings interposed between tactile matrix regions and cross-referenced touchscreen icons.

In a different aspect, Step 1702 locates a DI with a communication medium transmitter communicating the tactile matrix region selections. Then, loading the first and second reference maps in Steps 1704 and 1706, respectively, includes loading the reference maps into a DI map module, embedded in a device communicating with the DI via the first communication medium.

In one aspect, acknowledging the touchscreen icon engagement in Step 1716 includes the substeps of accepting a stylus with a transmitter, into a DI opening; and, generating an acknowledgement signal from the stylus in response to directing the stylus through the defined opening.

In another aspect, acknowledging the touchscreen icon engagement in Step 1716 includes the substeps of: associating a sensor with each opening through the DI; accepting a pointer in the defined opening; and, in response to sensing the pointer in the defined opening, generating an acknowledgement signal from the hole sensor.

A display interpreter system and method have been presented that permit a visually impaired person to access functions presented in equipment displays, without performing modifications to the equipment. Examples have been given of particular user interfaces and display interfaces. Other examples have been given of particular mapping processes and device usage. However, the invention is not limited to just these examples. Although examples have primarily been provided in the context of MFP equipment, the invention is applicable to almost any equipment that uses a display screen or touchscreen. Other variations and embodiments of the invention will occur to those skilled in the art.

We claim:

1. In a screen display interpreter device, a method for audibly interpreting a computing device screen display, the method comprising:

locating a display interpreter (DI) with a tactile matrix of sensors overlying a display touchscreen of a computing device with visible touchscreen icons, wherein the DI is electrically independent of the computing device and display touchscreen;

in response to sensing a proximate pointer, the display interpreter accepting a tactile matrix region selection;

the display interpreter mapping a touchscreen icon to the selected tactile matrix region;

the display interpreter audibly identifying the mapped touchscreen icon;

engaging the computing device touchscreen icon; and, the display interpreter acknowledging the computing device touchscreen icon engagement.

2. The method of claim 1 further comprising:

loading a first reference map, cross-referencing DI tactile matrix regions with a first field of touchscreen icons; and loading a second reference map, cross-referencing screen icons with audible recordings identifying the touchscreen icons.

3. The method of claim 2 wherein accepting the tactile matrix region selection includes monitoring a tactile matrix region sensor for a proximately located pointer; and wherein mapping the touchscreen icon to the selected tactile matrix region comprises, in response to sensing a proximately located pointer, cross-referencing the selected tactile matrix region to locate the touchscreen icon, using the first reference map.

4. The method of claim 3 wherein audibly identifying the screen icon includes:

using the second reference map, cross-referencing the located touchscreen icon to the audible recording identifying the touchscreen icon; and playing the recording.

5. The method of claim 1 wherein acknowledging the touchscreen icon engagement includes:

defining an opening through the DI associated with the mapped touchscreen icon;

accepting a pointer in the defined opening; and wherein engaging the touchscreen icon includes directing the pointer to the touchscreen icon through the defined opening.

6. The method of claim 5 wherein locating the DI with the tactile matrix overlying a touchscreen display includes locating a DI with a matrix of openings interposed between tactile matrix regions and cross-referenced touchscreen icons.

7. The method of claim 6 wherein acknowledging the touchscreen icon engagement includes:

accepting a stylus with a transmitter, into a DI opening; and, generating an acknowledgement signal from the stylus in response to directing the stylus through the defined opening.

8. The method of claim 6 wherein acknowledging the touchscreen icon engagement includes:

associating a sensor with each opening through the DI;

accepting a pointer in the defined opening;

in response to sensing the pointer in the defined opening, generating an acknowledgement signal from the hole sensor.

9. The method of claim 1 further comprising:

loading a first reference map, cross-referencing DI tactile matrix regions with a first field of touchscreen icons; and loading a second reference map, cross-referencing touchscreen icons with audible recordings identifying the touchscreen icons;

wherein locating the DI with the tactile matrix overlying the touchscreen display includes locating a DI with a communication medium transmitter communicating the tactile matrix region selections; and wherein loading the first and second reference maps includes loading the reference maps into a DI map module, embedded in a device communicating with the DI via the first communication medium.

10. The method of claim 1 further comprising:

following the acknowledgement of the touchscreen icon engagement:

loading a third reference map, cross-referencing tactile matrix regions with a second field of touchscreen icons; and loading a fourth reference map, cross-referencing touchscreen icons with audible recordings identifying the touchscreen icons.

11. The method of claim 1 wherein accepting the tactile matrix region selection in response to sensing the proximate pointer includes:

accepting a stylus with a transmitter, located proximate to a tactile matrix region; and, generating a region select signal from the stylus in response to locating the stylus proximate to the tactile matrix region.

12. An audible screen display interpreter (DI) system for operating a computer device with screen icons, the system comprising:

a display touchscreen interface for mounting on a computer device screen displaying touchscreen icons;

a tactile matrix interface (TMI) for accepting tactile matrix region selections;

a mapping module for mapping a selected tactile matrix region to an underlying touchscreen icon and generating an audio signal identifying the mapped touchscreen icon;

an audio output generator to project the audio signal;

wherein the display screen interface, TMI, mapping module, and audio output generator are electrically independent of the computer device and the computing device touchscreen; and, wherein the tactile matrix interface generates an acknowledgement in response to the engagement of a touchscreen icon on the computing device touchscreen.

13. The system of claim 12 wherein the map module comprises a first reference map, cross-referencing tactile matrix regions with a first field of touchscreen icons, and a second reference map, cross-referencing touchscreen icons with audible recordings identifying the touchscreen icons; and, wherein the map module supplies an audio recording identifying a touchscreen icon, in response to accepting a tactile matrix region selection.

14. The system of claim 13 wherein the tactile matrix interface includes a sensor for monitoring a pointer proximate to a tactile matrix interface region and generating a proximate pointer signal; and wherein the map module and uses the first reference map to cross-reference a touchscreen icon to a tactile matrix region generating the proximate pointer signal.

15. The system of claim 14 wherein the map module uses the second reference map to cross-reference a touchscreen icon to the audible recording identifying the touchscreen icon; and wherein the audio output generator plays the recording identifying the touchscreen icon.

16. The system of claim 12 wherein the tactile matrix interface generates an acknowledgement signal in response to accepting a pointer in a first opening in the tactile matrix interface associated with the first region; and, wherein the touchscreen interface engages a first touchscreen icon by guiding a pointer through a first opening in the touchscreen interface directed at the first touchscreen icon.

17. The system of claim 16 wherein the tactile matrix interface and touchscreen interface form a matrix of cooperating openings, where each opening is associated with a tactile matrix region and directed at a corresponding touchscreen icon.

18. The system of claim 17 wherein the tactile matrix interface further comprises a hole sensor associated with each opening to generate an acknowledgement signal in response to sensing a pointer in the opening.

19. The system of claim 12 wherein the map module is embedded in a first device with a first communication medium receiver, the map module comprising a first reference map, cross-referencing tactile matrix regions with a first field of touchscreen icons, and a second reference map, cross-referencing touchscreen icons with audible recordings identifying the screen icons; and, wherein the tactile matrix interface is embedded in a second device that includes a first communication medium transmitter to supply the tactile matrix region selections to the map module.

20. The system of claim 19 wherein the audio output generator is embedded with the map module.

21. The system of claim 12 wherein the map module includes a first reference map, cross-referencing tactile matrix regions with a first field of screen icons, and a second reference map cross-referencing touchscreen icons with audible recordings identifying the touchscreen icons; and, wherein the map module, in response to accepting an engagement acknowledgement from the touchscreen interface, loads a third reference map, cross-referencing tactile matrix regions with a second field of touchscreen icons, and loads a second reference map cross-referencing touchscreen icons with audible recordings identifying the touchscreen icons.

22. The system of claim 12 wherein the tactile matrix interface comprises a stylus with a transmitter to send an acknowledgement of a touchscreen icon engagement in response to being inserted through a touchscreen interface opening.

23. The system of claim 22 wherein the stylus includes a wireless transmitter for generating an acknowledgement signal; and, wherein the mapping module includes a wireless receiver accepting the acknowledgement signal from the stylus.

24. The system of claim 12 wherein the tactile matrix interface comprises a stylus with a switch and a transmitter to send an acknowledgement of a touchscreen icon engagement in response to:

selecting a tactile matrix region; and, engaging the switch.

25. The system of claim 12 wherein the tactile matrix interface comprises a stylus with a transmitter to send a region select signal to the map module in response to being located proximate to a tactile matrix region.

* * * * *